US011599169B2

(12) United States Patent
Kennedy et al.

(10) Patent No.: US 11,599,169 B2
(45) Date of Patent: Mar. 7, 2023

(54) SYSTEM AND METHOD OF UTILIZING FANS WITH INFORMATION HANDLING SYSTEMS

(71) Applicant: Dell Products L.P., Round Rock, TX (US)

(72) Inventors: Jeffrey Leighton Kennedy, Austin, TX (US); Tim M. Lambert, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 86 days.

(21) Appl. No.: 16/855,436

(22) Filed: Apr. 22, 2020

(65) Prior Publication Data
US 2021/0333849 A1 Oct. 28, 2021

(51) Int. Cl.
G06F 1/20 (2006.01)
H05K 7/20 (2006.01)
G06F 1/3228 (2019.01)

(52) U.S. Cl.
CPC ............ *G06F 1/206* (2013.01); *G06F 1/3228* (2013.01); *H05K 7/20136* (2013.01); *H05K 7/20209* (2013.01)

(58) Field of Classification Search
CPC ... G06F 1/206; G06F 1/3228; H05K 7/20136; H05K 7/20209
USPC ....................... 700/299; 361/679.46; 709/224
See application file for complete search history.

(56) References Cited

U.S. PATENT DOCUMENTS

| 10,935,960 | B2 * | 3/2021 | York | G06F 1/20 |
| 2008/0278905 | A1 * | 11/2008 | Artman | H05K 7/20836 361/679.48 |
| 2009/0119523 | A1 * | 5/2009 | Totten | G06F 1/26 713/322 |
| 2011/0224837 | A1 * | 9/2011 | Moss | G06F 1/3234 700/295 |
| 2014/0114496 | A1 * | 4/2014 | Berry | H05K 7/20836 700/299 |
| 2014/0211676 | A1 * | 7/2014 | Chhabra | H04W 52/0209 370/311 |
| 2017/0168530 | A1 * | 6/2017 | Remis | G06F 1/206 |
| 2017/0315599 | A1 * | 11/2017 | Marripudi | G06F 1/206 |
| 2017/0322816 | A1 * | 11/2017 | Parthiban | G06F 9/4416 |

(Continued)

FOREIGN PATENT DOCUMENTS

JP 2013092822 A * 5/2013

*Primary Examiner* — Thomas C Lee
*Assistant Examiner* — Michael Tang
(74) *Attorney, Agent, or Firm* — McDermott Will & Emery LLP

(57) ABSTRACT

In one or more embodiments, one or more systems, one or more methods, and/or one or more processes may: store, by an integrated circuit (IC) of an information handling system (IHS), first multiple fan speed values and second multiple fan speed values; determine, by the IC, that a baseboard management controller is impaired to control fans of the IHS; if the IHS is in the information processing mode: provide, by the IC, the first multiple fan speed values to fan modules; and set, by the fan modules, fan speeds of fans of the IHS based at least on the first multiple fan speed values; and if the IHS is not in the information processing mode: provide, by the IC, the second multiple fan speed values to the fan modules; and set, by the fan modules, the speeds of the fans based at least on the second multiple fan speed values.

18 Claims, 10 Drawing Sheets

(56) References Cited

U.S. PATENT DOCUMENTS

| | | | |
|---|---|---|---|
| 2020/0011339 A1* | 1/2020 | Li | G06F 1/20 |
| 2020/0146179 A1* | 5/2020 | Zhan | G06F 1/20 |
| 2021/0141626 A1* | 5/2021 | Ladkani | G06F 3/0655 |

* cited by examiner

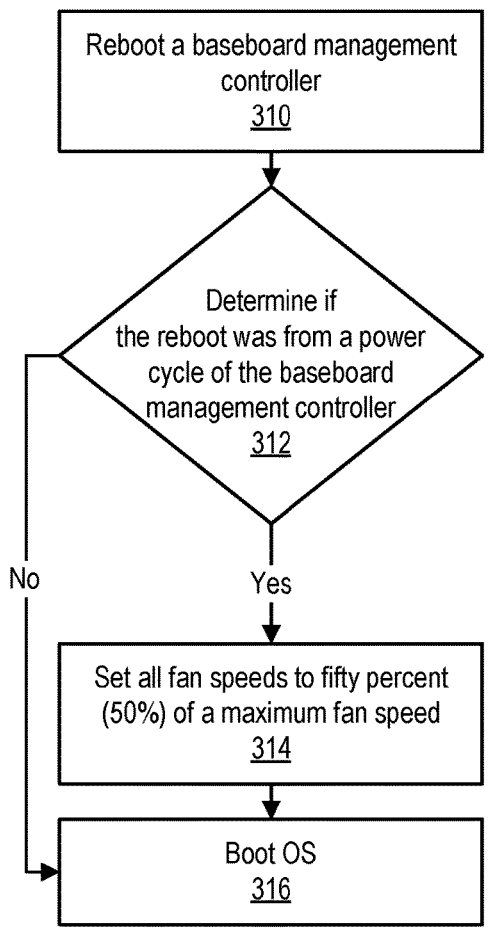
FIG. 3A
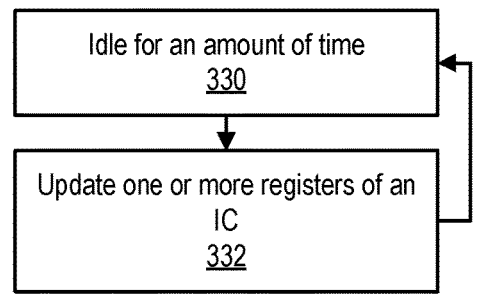
FIG. 3B
FIG. 3C
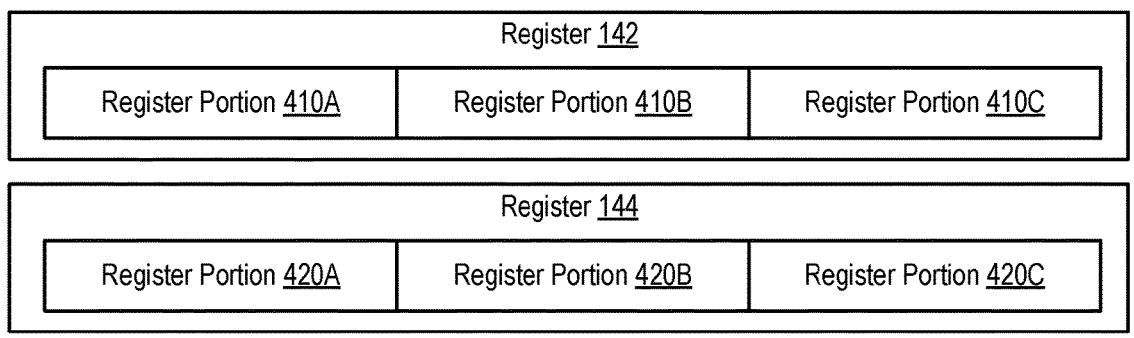
FIG. 4

SYSTEM AND METHOD OF UTILIZING FANS WITH INFORMATION HANDLING SYSTEMS

BACKGROUND

Field of the Disclosure

This disclosure relates generally to information handling systems and more particularly to utilizing fans with information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one or more embodiments, one or more systems, one or more methods, and/or one or more processes may receive, by a baseboard management controller of an information handling system, multiple thermal measurement values respectively associated with multiple physical zones of the information handling system; may determine, by the baseboard management controller, first multiple fan speed values based at least on the multiple thermal measurement values; may determine, by the baseboard management controller, second multiple fan speed values based at least on configuration information associated with a power conservation mode of the information handling system; may provide, by the baseboard management controller, the first multiple fan speed values and the second multiple fan speed values to an integrated circuit (IC) of the information handling system; may store, by the IC, the first multiple fan speed values and the second multiple fan speed values in multiple registers of the IC respectively associated with the multiple physical zones; may determine, by the IC, that the baseboard management controller is impaired to control the multiple fans; may determine, by the IC, if the information handling system is in the information processing mode; if the information handling system is in the information processing mode: may retrieve, by the IC, the first multiple fan speed values from the multiple registers; and may provide, by the IC, the first multiple fan speed values to the multiple fan modules; if the information handling system is not in the information processing mode: may retrieve, by the IC, the second multiple fan speed values from the multiple registers; and may provide, by the IC, the second multiple fan speed values to the multiple fan modules; and may set the multiple speeds of the multiple fans based at least on the fan speed increment information.

In one or more embodiments, the one or more systems, the one or more methods, and/or the one or more processes may further, if the information handling system is in the information processing mode, determine, by the IC, if a fan speed threshold is to be utilized. If the fan speed threshold is not to be utilized, the one or more systems, the one or more methods, and/or the one or more processes may further periodically: provide, by the IC, first fan speed increment information to a fan module of the multiple modules associated with the fan; and set, by the fan module, a fan speed based at least on the first fan speed increment information, until each fan of the multiple fans reaches its maximum fan speed.

In one or more embodiments, the one or more systems, the one or more methods, and/or the one or more processes, if the fan speed threshold is to be utilized, may further retrieve, by the IC, threshold fan speed information associated with a threshold fan speed less than a maximum fan speed. In one or more embodiments, the one or more systems, the one or more methods, and/or the one or more processes, may further periodically: provide, by the IC, second fan speed increment information to the multiple fan modules; and set, by the multiple fan modules, the multiple speeds of the multiple based at least on the second fan speed increment information, until the multiple fans reach the threshold fan speed In one or more embodiments, the one or more systems, the one or more methods, and/or the one or more processes, if the information handling system is not in the information processing mode, may further, periodically: provide, by the IC, fan speed increment information to the multiple fan modules; and set, by the multiple fan modules, the multiple speeds of the multiple fans based at least on the fan speed increment information, until the multiple fans reach a maximum fan speed.

In one or more embodiments, the information handling system may be associated with a power budget. For example, the threshold fan speed information may be based at least on the power budget. In one or more embodiments, the IC may include at least one of a field programmable gate array (FPGA), a complex logic device (CPLD), and an application specific integrated circuit (ASIC). In one or more embodiments, a physical zone of the multiple physical zones may include a volatile memory medium of the information handling system. In one or more embodiments, determining that the baseboard management controller is impaired to control the multiple fans may include determining that a watchdog timer has timed out.

In one or more embodiments, the IC may be configured to receive fan speed information via a bus coupled to the baseboard management controller and the IC. For example, the IC may determine that traffic has occurred on the bus and reset the watchdog timer in response to determining that the traffic has occurred on the bus. In one or more embodiments, determining that the baseboard management controller is impaired to control the multiple fans may include determining that a signal from the baseboard management controller to the IC has changed. In one or more embodiments, the one or more systems, the one or more methods, and/or the one or more processes may further, in response to determining that the baseboard management controller is impaired to control the multiple fans, configure, by the IC, a multiplexer to provide information from the IC to the multiple fan modules.

In one or more embodiments, the one or more systems, the one or more methods, and/or the one or more processes may further convert, by a sensor of the information handling system, an ambient temperature of a zone of the multiple zones to a thermal measurement value of the multiple thermal measurement values. For example, receiving the multiple thermal measurement values may include receiving the thermal measurement value of the multiple thermal measurement values from the sensor. For instance, the first fan speed information may be based at least on the thermal measurement value from the sensor. In one or more embodiments, the first fan speed information may include a first pulse width modulation (PWM) value, and the second fan speed information may include a second PWM value.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which:

FIG. 3A illustrates an example of a method of operating a baseboard management controller, according to one or more embodiments;

FIG. 3B illustrates a second example of a method of operating a baseboard management controller, according to one or more embodiments;

FIG. 3C illustrates another example of a method of operating a baseboard management controller, according to one or more embodiments;

FIG. 4 illustrates examples of portions of registers, according to one or more embodiments;

DETAILED DESCRIPTION

Figure 1A:
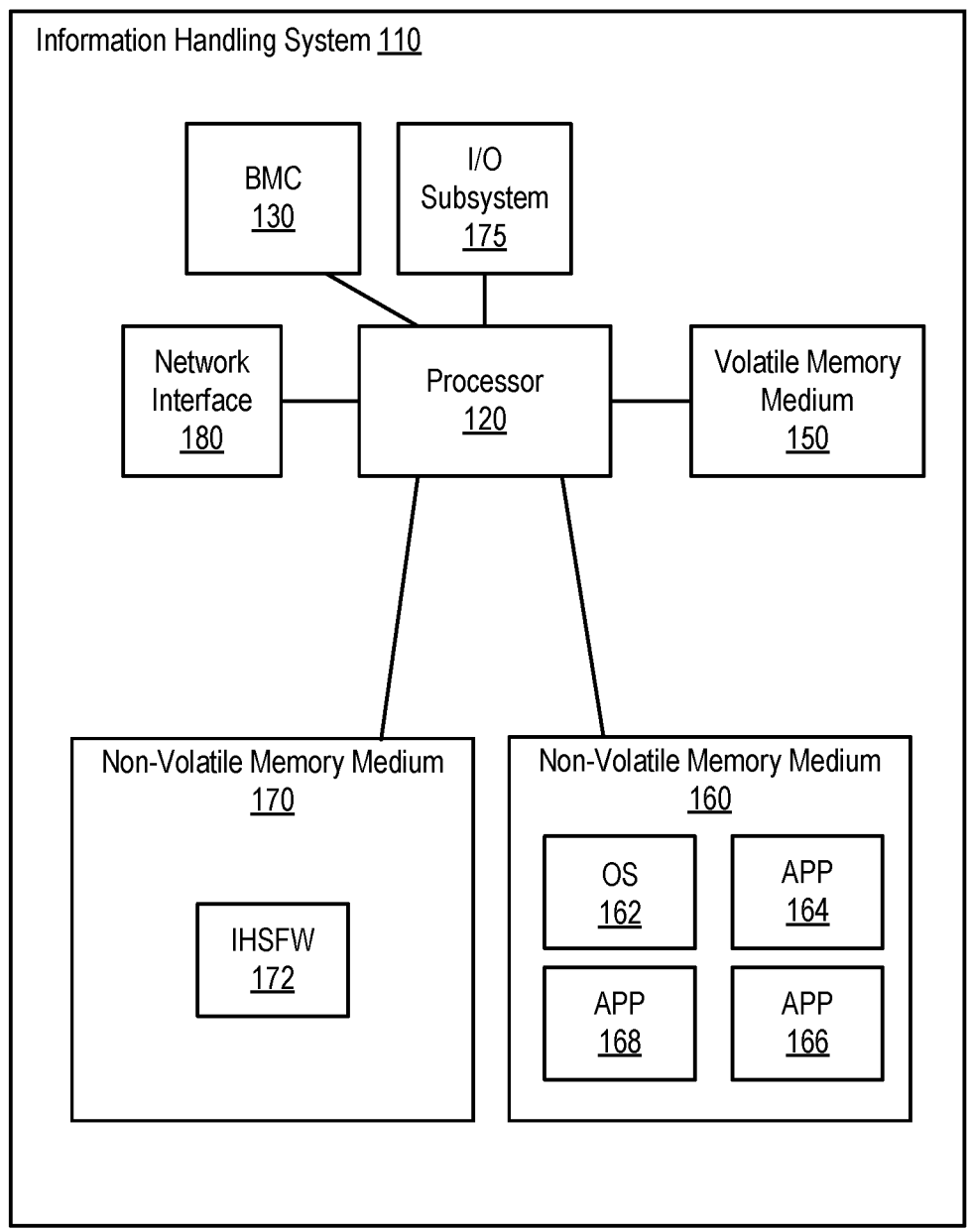
FIG. 1A illustrates an example of an information handling system, according to one or more embodiments.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

In one or more embodiments, a fan of an information handling system may be controlled via processor and instructions executed by the processor. If a problem occurs with a system that includes the processor, the fan may not be controlled. If the fan is not controlled, issues of cooling the information handling system may occur. It may be determined that the problem occurs with the information handling system, and in response, a speed of the fan may be increased to one hundred percent (100%). As an example, the fan may be controlled by a remote access controller, and the remote access controller may reboot or hang while a host workload of the information handling system may transition from a minimum load to a maximum load. A boot loader of the remote access controller may determine that the information handling system is on (e.g., executing instructions, processing information, etc.) and may increase all fan speeds of the information handling system to one hundred percent (100%). For instance, the boot loader of the remote access controller may provide pulse width modulation (PWM) signals to all fan of the information handling system so that speeds of the fans are increased to one hundred percent (100%). This may last for about sixty seconds until a thermal process of the remote access controller can determine one or more thermal measurements associated with the information handling system and adjust speeds of the fans based at least on the one or more thermal measurements associated with the information handling system. As another example, if a maximum power utilization is associated with the information handling system, increasing the speeds of the fans are increased to one hundred percent (100%) may cause the maximum power utilization to be reached or exceeded. If the maximum power utilization is reached or exceeded, one or more information processing capabilities of the information handling system may be decreased. For instance, the one or more information processing capabilities of the information handling system may be throttled down.

In one or more embodiments, fan speeds may be periodically increased if the remote access controller reboots or hangs. An integrated circuit (IC) may determine that the remote access controller is impaired to control the fans of the information handling system. In response to determining that the remote access controller is impaired to control the fans, the IC may take control of controlling the fan speeds and may periodically increase the fan speeds. In one example, the fans speeds may be periodically increased until a maximum fan speed is reached. In another example, a power budget may be associated with the information handling system, and a threshold fan speed may be associated with the power budget. The threshold fan speed may be less than the maximum fan speed. For instance, the fans speeds may be periodically increased until the threshold fan speed is reached.

Turning now to FIG. 1A, an example of an information handling system is illustrated, according to one or more embodiments. An information handling system (IHS) 110 may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, IHS 110 may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS 110 may include or have a form factor of that of or similar to one or more of a laptop, a notebook, a telephone, a tablet, and a PDA, among others. For example, a portable IHS 110 may be readily carried and/or transported by a user (e.g., a person). In one or more embodiments, components of IHS 110 may include one or more storage devices, one or more communications ports for communicating with external devices as well as various input and output (I/O) devices, such as a keyboard, a mouse, and a video display, among others. In one or more embodiments, IHS 110 may include one or more buses operable to transmit communication between or among two or more hardware components. In one example, a bus of IHS 110 may include one or more of a memory bus, a peripheral bus, and a local bus, among others. In another example, a bus of IHS 110 may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit (I²C) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, IHS 110 may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

As shown, IHS 110 may include a processor 120, a baseboard management controller (BMC) 130, a volatile memory medium 150, non-volatile memory media 160 and 170, an I/O subsystem 175, and a network interface 180. As illustrated, BMC 130, volatile memory medium 150, non-volatile memory media 160 and 170, I/O subsystem 175, and network interface 180 may be communicatively coupled to processor 120.

In one or more embodiments, one or more of BMC 130, volatile memory medium 150, non-volatile memory media 160 and 170, I/O subsystem 175, and network interface 180 may be communicatively coupled to processor 120 via one or more buses, one or more switches, and/or one or more root complexes, among others. In one example, one or more of BMC 130, volatile memory medium 150, non-volatile memory media 160 and 170, I/O subsystem 175, and network interface 180 may be communicatively coupled to processor 120 via one or more PCI-Express (PCIe) root complexes. In another example, one or more of BMC 130, I/O subsystem 175 and network interface 180 may be communicatively coupled to processor 120 via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

Volatile memory medium 150 may include volatile storage such as, for example, RAM, DRAM (dynamic RAM), EDO RAM (extended data out RAM), SRAM (static RAM), etc. One or more of non-volatile memory media 160 and 170 may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, network interface 180 may be utilized in communicating with one or more networks and/or one or more other information handling systems. In one example, network interface 180 may enable IHS 110 to communicate via a network utilizing a suitable transmission protocol and/or standard. In a second example, network interface 180 may be coupled to a wired network. In a third example, network interface 180 may be coupled to an optical network. In another example, network interface 180 may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, network interface 180 may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, processor 120 may execute processor instructions in implementing at least a portion of one or more systems, at least a portion of one or more flowcharts, at least a portion of one or more methods, and/or at least a portion of one or more processes described herein. In one example, processor 120 may execute processor instructions from one or more of memory media 150, 160, and 170 in implementing at least a portion of one or more systems, at least a portion of one or more flowcharts, at least a portion of one or more methods, and/or at least a portion of one or more processes described herein. In another example, processor 120 may execute processor instructions via network interface 180 in implementing at least a portion of one or more systems, at least a portion of one or more flowcharts, at least a portion of one or more methods, and/or at least a portion of one or more processes described herein.

In one or more embodiments, processor 120 may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, processor 120 may interpret and/or execute program instructions and/or process data stored locally (e.g., via memory media 150, 160, and 170 and/or another component of IHS 110). In another example, processor 120 may interpret and/or execute program instructions and/or process data stored remotely (e.g., via a network storage resource).

In one or more embodiments, I/O subsystem 175 may represent a variety of communication interfaces, graphics interfaces, video interfaces, user input interfaces, and/or peripheral interfaces, among others. For example, I/O subsystem 175 may include one or more of a touch panel and a display adapter, among others. For instance, a touch panel may include circuitry that enables touch functionality in conjunction with a display that is driven by a display adapter.

As shown, non-volatile memory medium 160 may include an operating system (OS) 162, and applications (APPs) 164-168. In one or more embodiments, one or more of OS 162 and APPs 164-168 may include processor instructions executable by processor 120. In one example, processor 120 may execute processor instructions of one or more of OS 162 and APPs 164-168 via non-volatile memory medium 160. In another example, one or more portions of the processor instructions of the one or more of OS 162 and APPs 164-168 may be transferred to volatile memory medium 150, and processor 120 may execute the one or more portions of the processor instructions of the one or more of OS 162 and APPs 164-168 via volatile memory medium 150.

As illustrated, non-volatile memory medium 170 may include information handling system firmware (IHSFW) 172. In one or more embodiments, IHSFW 172 may include processor instructions executable by processor 120. For example, IHSFW 172 may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, processor 120 may execute processor instructions of IHSFW 172 via non-volatile memory medium 170. In another instance, one or more portions of the processor instructions of IHSFW 172 may be transferred to volatile memory medium 150, and processor 120 may execute the one or more portions of the processor instructions of IHSFW 172 via volatile memory medium 150.

In one or more embodiments, processor 120 and one or more components of IHS 110 may be included in a system-on-chip (SoC). For example, the SoC may include processor 120 and a platform controller hub (not specifically illustrated).

In one or more embodiments, BMC 130 may be or include a remote access controller. For example, the remote access controller may be or include a DELL™ Remote Access Controller (DRAC). In one or more embodiments, a remote access controller may be integrated into IHS 110. For example, the remote access controller may be or include an integrated DELL™ Remote Access Controller (iDRAC). In one or more embodiments, a remote access controller may include one or more of a processor, a memory, and a network interface, among others. In one or more embodiments, a remote access controller may access one or more busses and/or one or more portions of IHS 110. For example, the remote access controller may include and/or may provide power management, virtual media access, and/or remote console capabilities, among others, which may be available via a web browser and/or a command line interface. For instance, the remote access controller may provide and/or permit an administrator (e.g., a user) one or more abilities to configure and/or maintain an information handling system as if the administrator was at a console of the information handling system and/or had physical access to the information handling system.

In one or more embodiments, a remote access controller may interface with baseboard management controller integrated circuits. In one example, the remote access controller may be based at least on an Intelligent Platform Management Interface (IPMI) standard. For instance, the remote access controller may allow and/or permit utilization of IPMI out-of-band interfaces such as IPMI Over LAN (local area network). In another example, the remote access controller may be based at least on a Redfish standard. In one instance, one or more portions of the remote access controller may be compliant with one or more portions of a Redfish standard. In another instance, one or more portions of the remote access controller may implement one or more portions of a Redfish standard. In one or more embodiments, a remote access controller may include and/or provide one or more internal private networks. For example, the remote access controller may include and/or provide one or more of an Ethernet interface, a front panel USB interface, and a Wi-Fi interface, among others. In one or more embodiments, a remote access controller may be, include, or form at least a portion of a virtual KVM (keyboard, video, and mouse) device. For example, a remote access controller may be, include, or form at least a portion of a KVM over IP (IPKVM) device. For instance, a remote access controller may capture video, keyboard, and/or mouse signals; may convert the signals into packets; and may provide the packets to a remote console application via a network.

In one or more embodiments, BMC 130 may be or include a microcontroller. For example, the microcontroller may be or include an 8051 microcontroller, an ARM Cortex-M (e.g., Cortex-M0, Cortex-M1, Cortex-M3, Cortex-M4, Cortex-M7, etc.) microcontroller, a MSP430 microcontroller, an AVR (e.g., 8-bit AVR, AVR-32, etc.) microcontroller, a PIC microcontroller, a 68HC11 microcontroller, a ColdFire microcontroller, and a Renesas microcontroller, among others. In one or more embodiments, BMC 130 may be or include an application processor. In one example, BMC 130 may be or include an ARM Cortex-A processor. In another example, BMC 130 may be or include an Intel Atom processor. In one or more embodiments, BMC 130 may be or include one or more of a field programmable gate array (FPGA) and an ASIC, among others, configured, coded, and/or encoded with instructions in accordance with at least a portion of one or more of systems, at least a portion of one or more flowcharts, at least a portion of one or more methods, and/or at least a portion of one or more processes described herein.

Figure 1B:
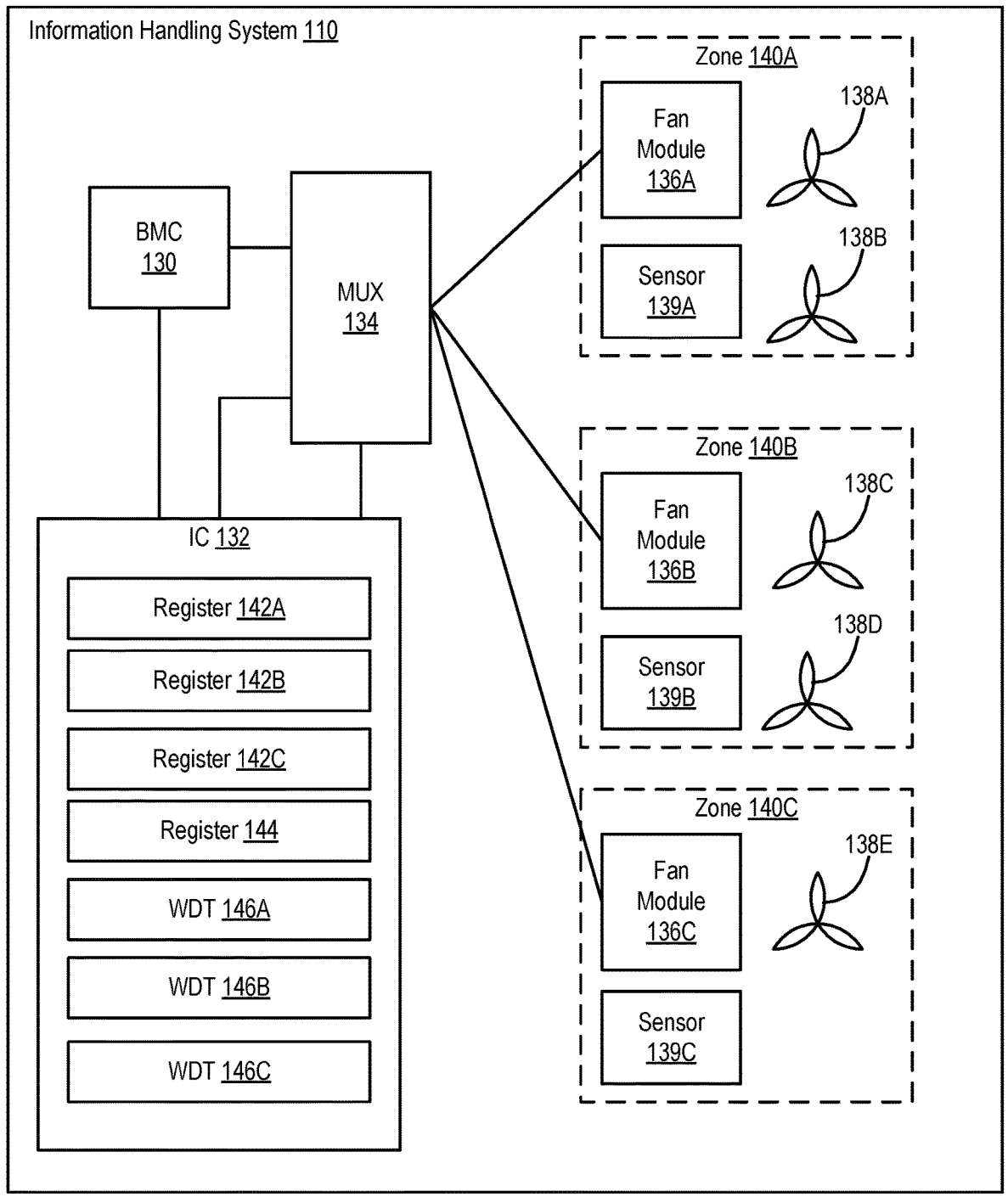
FIG. 1B illustrates another example of an information handling system, according to one or more embodiments.

Turning now to FIG. 1B, another example of an information handling system is illustrated, according to one or more embodiments. As shown, IHS 110 may include an IC 132 coupled to BMC 130. In one or more embodiments, IC 132 may include at least one of a FPGA, a complex logic device (CPLD), and an ASIC. In one or more embodiments, IC 132 may be configured to implement at least a portion of one or more systems, at least a portion of one or more flowcharts, at least a portion of one or more methods, and/or at least a portion of one or more processes described herein. As illustrated, IHS 110 may include a multiplexer (MUX) 134. As shown, BMC 130 and IC 132 may be coupled to MUX 134. As illustrated, IHS 110 may include fan modules 136A-136C coupled to MUX 134. In one or more embodiments, a fan module 136 may receive a signal from MUX 134 and control one or more fans 138 based at least on the signal from MUX 134.

As shown, IHS 110 may include fans 138A-138E. In one or more embodiments, a fan 138 may draw air from IHS 110. For example, one or more of fans 138A-138E may draw air from IHS 110 (e.g., expel air from IHS 110). In one or more embodiments, a fan 138 may draw air into IHS 110. For example, one or more of fans 138A-138E may draw air into IHS 110. In one or more embodiments, a fan 138 may move air within IHS 110. For example, one or more of fans 138A-138E may move air within IHS 110. Although five fans 138 are illustrated, IHS 110 may include any number of fans, according to one or more embodiments. Although not specifically illustrated, fans 138A and 138B may be coupled to fan module 136A, fans 138C and 138D may be coupled to fan module 136B, and fan 138E may be coupled to fan module 136C, according to one or more embodiments.

As illustrated, IHS 110 may include sensors 139A-139C. For example, a sensor 139 may be configured to convert an ambient temperature to thermal information. For instance, the thermal information may include digital data. In one or more embodiments, a sensor 139 may provide thermal information, based at least on an ambient temperature, to BMC 130. As shown, one or more fans may be associated with a physical zone 140 of IHS 110. Fans 138A and 138B and sensor 139A may be associated with a physical zone 140A. Fans 138C and 138D and sensor 139B may be associated with a physical zone 140B. Fan 138E and sensor 139C may be associated with a physical zone 140C. In one or more embodiments, a zone 140 may include at least one fan 138 and at least one sensor 139.

As illustrated, IC 132 may include registers 142A-142C, a register 144, and watchdog timers (WDTs) 146A-146C. WDTs 146A-146C may be respectively associated with zones 140A-140C. Registers 142A-142C may be respectively associated with zones 140A-140C. In one or more embodiments, register 142 may be a fan takeover control/status register (FTCSR). A first portion of register 142 may store fan speed information associated with IHS 110 in an information processing mode (e.g., ACPI power state S0). The fan speed information may be stored as a PWM value. A second portion of register 142 may store fan speed information associated with IHS 110 in a power conservation mode or stand-by mode (e.g., ACPI power state S5). The fan speed information may be stored as a PWM value. If IC 132 takes control of fans 138A-138E, IC 132 may access information stored via a register 142 and utilize that information to control speeds of one or more fans 138 of a zone 140 associated with register 142. As an example, IC 132 may access information stored via register 142A and utilize that information to control speeds of fans 138A and 138B of zone 140A. As another example, IC 132 may access information stored via register 142C and utilize that information to control speeds of fan 138E of zone 140C. In one or more embodiments, the information stored via register 142 may be initial PWM values to control one or more speeds of the one or more fans 138 of an associated zone 140.

In one or more embodiments, register 144 may be a power cap fan control register (PCFCR). For example, register 144 may store threshold fan speed information. In one or more embodiments, IC 132 may control MUX 134. MUX 134 may provide data from BMC 132 or may provide data from IC 132 to fan modules 136A-136C based at least on one or more control signals from IC 132. In one or more embodiments, a first portion of register 144 may store enablement information. For example, the enablement information may indicate whether or not a fan speed threshold is to be utilized. A second portion of register 144 may store fan speed threshold information to be utilized when the fan speed threshold is to be utilized. The fan speed threshold information may be stored as a PWM value. In one or more embodiments, when IC 132 controls one or more fans 138A-138E, IC 132 may increase one or more speeds of one or more fans 138A-138E up to a fan speed threshold if the fan speed threshold is enabled.

In one or more embodiments, BMC 130 may write to registers 142A-142C when BMC 130 boots. BMC 130 may start WDTs 146A-146C and may periodically provide information to WDTs 146A-146C. For example, BMC 130 may periodically pet or feed WDTs 146A-146C. In one or more embodiments, BMC 130 may update fan speed data. For example, BMC 130 may store an update to fan speed data in a memory medium of BMC 130. After BMC 130 updates the fan speed data, BMC 130 may provide the fan speed data to IC 132. For example, BMC 130 may write the fan speed data to a register 142 of IC 132. In one instance, BMC 130 may write first fan speed data to a register 142A. In a second instance, BMC 130 may write second fan speed data to a register 142B. In another instance, BMC 130 may write third fan speed data to a register 142B. As one example, two or more of the first fan speed data, the second fan speed data, and the third fan speed data may be the same. As another example, two or more of the first fan speed data, the second fan speed data, and the third fan speed data may be different.

Figure 2:
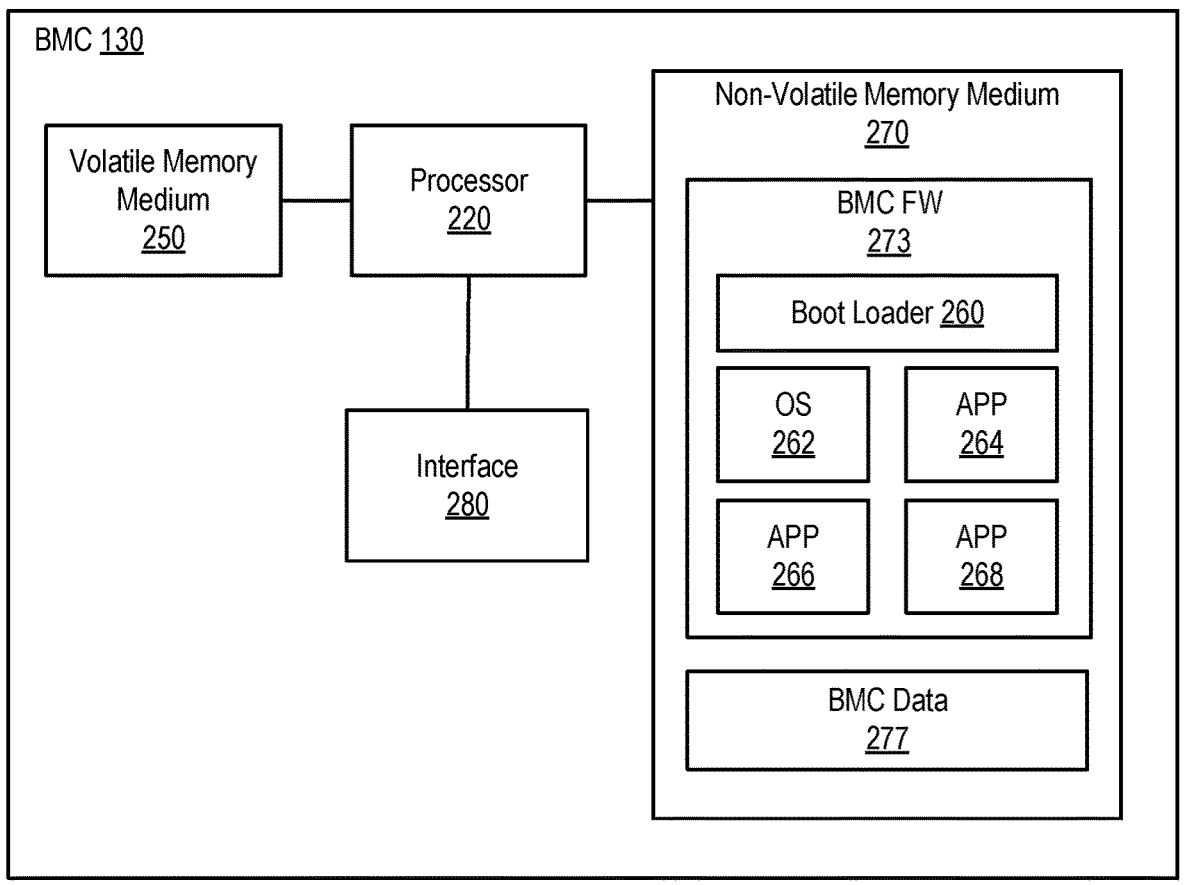
FIG. 2 illustrates an example of a baseboard management controller, according to one or more embodiments.

Turning now to FIG. 2, an example of a baseboard management controller is illustrated, according to one or more embodiments. As shown, BMC 130 may include a processor 220, a volatile memory medium 250, a non-volatile memory medium 270, and an interface 280. As illustrated, non-volatile memory medium 270 may include a BMC firmware (FW) 273, which may include a boot loader 260, an OS 262 and APPs 264-268, and may include BMC data 277. In one example, boot loader 260 may include Das U-Boot. In a second example, boot loader 260 may include coreboot. In a third example, boot loader 260 may include Libreboot. In a fourth example, OS 262 may be or include a real-time operating system (RTOS). In a fifth example, OS 262 may be or include an Unix-like operating system. For instance, the Unix-like operating system may be or include Linux, FreeBSD, NetBSD, OpenBSD, Minix, Xinu, or Darwin, among others. In another example, OS 262 may be or include a portable operating system interface (POSIX) compliant operating system.

In one or more embodiments, interface 280 may include circuitry that enables communicatively coupling to one or more devices. In one example, interface 280 may include circuitry that enables communicatively coupling to one or more buses. For instance, the one or more buses may include one or more buses described herein, among others. In a second example, interface 280 may include circuitry that enables one or more interrupt signals to be received. In one instance, interface 280 may include general purpose input/output (GPIO) circuitry, and the GPIO circuitry may enable one or more interrupt signals to be received and/or provided via at least one interrupt line. In another instance, interface 280 may include GPIO circuitry that may enable BMC 130 to provide and/or receive signals associated with other circuitry (e.g., diagnostic circuitry, etc.). In a third example, interface 280 may include circuitry that enables communicatively coupling to one or more networks. In one instance, interface 280 may include circuitry that enables communicatively coupling to network interface 180. In another example, interface 280 may include a network interface.

In one or more embodiments, one or more of OS 262 and APPs 264-268 may include processor instructions executable by processor 220. In one example, processor 220 may execute processor instructions of one or more of boot loader 260, OS 262 and APPs 264-268 via non-volatile memory medium 270. In another example, one or more portions of the processor instructions of the one or more of boot loader 260, OS 262 and APPs 264-268 may be transferred to volatile memory medium 250, and processor 220 may execute the one or more portions of the processor instructions of the one or more of boot loader 260, OS 262 and APPs 264-268 via volatile memory medium 250. In one or more embodiments, processor 220 may execute instructions in accordance with at least a portion of one or more systems, at least a portion of one or more flowcharts, one or more methods, and/or at least a portion of one or more processes described herein. For example, non-volatile memory medium 270 and/or volatile memory medium 250 may store instructions that may be executable in accordance with at least a portion of one or more systems, at least a portion of one or more flowcharts, at least a portion of one or more methods, and/or at least a portion of one or more processes described herein. In one or more embodiments, processor 220 may execute instructions in accordance with at least a portion of one or more of systems, flowcharts, at least a portion of one or more methods, and/or at least a portion of one or more processes described herein. For example, non-volatile memory medium 270 and/or volatile memory medium 250 may store instructions that may be executable in accordance with at least a portion of one or more of systems, at least a portion of one or more flowcharts, at least a portion of one or more methods, and/or at least a portion of one or more processes described herein. In one or more embodiments, processor 220 may utilize BMC data 277. In one example, processor 220 may utilize BMC data 277 via non-volatile memory medium 270. In another example, one or more portions of BMC data 277 may be transferred to volatile memory medium 250, and processor 220 may utilize BMC data 277 via volatile memory medium 250.

Turning now to FIG. 3A, an example of a method of operating a baseboard management controller is illustrated, according to one or more embodiments. At 310, a baseboard management controller may be rebooted. For example, BMC 130 may be rebooted. At 312, it may be determined if the reboot was from a power cycle of the baseboard management controller. For example, boot loader 260 may determine if the reboot was a power cycle of BMC 130. If the reboot was from a power cycle of the baseboard management controller, the boot loader may set all fan speeds to fifty percent (50%) of a maximum fan speed, at 314. For example, boot loader 260 may set all fan speeds of fans 138A-138E to fifty percent (50%) of a maximum fan speed. In one or more embodiments, the method may proceed to 316. If the reboot was not from a power cycle of the baseboard management controller, the boot loader may boot an OS, at 325. For example, boot loader 260 may boot OS 262. If the reboot was not from a power cycle of the baseboard management controller, the boot loader may not alter a speed of a fan. For example, boot loader 260 may not alter a speed of one or more of fans 138A-138E. In one or more embodiments, if the reboot was not from a power cycle of the baseboard management controller, the baseboard management controller may retain previously stored fan speed information. For example, the previously stored fan speed information may match fans speeds for a processing load of the information handling system better than setting all fan speeds to fifty percent (50%) of the maximum fan speed.

Turning now to FIG. 3B, a second example of a method of operating a baseboard management controller is illustrated, according to one or more embodiments. At 320, the baseboard management controller may idle for an amount of time. For example, BMC 130 may idle for an amount of time. In one or more embodiments, the amount of time may be one to five seconds. At 322, the baseboard management controller may update an IC. For example, BMC 130 may update register 144 of IC 132. For instance, BMC 130 may update register 144 with enablement information and/or maximum fan speed information. The method may proceed to 320, according to one or more embodiments. In one or more embodiments, the method illustrated in FIG. 3B may be utilized by a background process of BMC 130. For example, the background process of BMC 130 may include a daemon process.

Turning now to FIG. 3C, another example of a method of operating a baseboard management controller is illustrated, according to one or more embodiments. At 330, the baseboard management controller may idle for an amount of time. For example, BMC 130 may idle for an amount of time. In one or more embodiments, the amount of time may be one to five seconds. At 332, the baseboard management controller may update one or more registers of an IC. For example, BMC 130 may update one or more of registers 142A-142C of IC 132. For instance, BMC 130 may update one or more of registers 142A-142C with fan speed data. The method may proceed to 330, according to one or more embodiments. In one or more embodiments, the method illustrated in FIG. 3C may be utilized by a background process of BMC 130. For example, the background process of BMC 130 may include a daemon process.

Figure 3D:
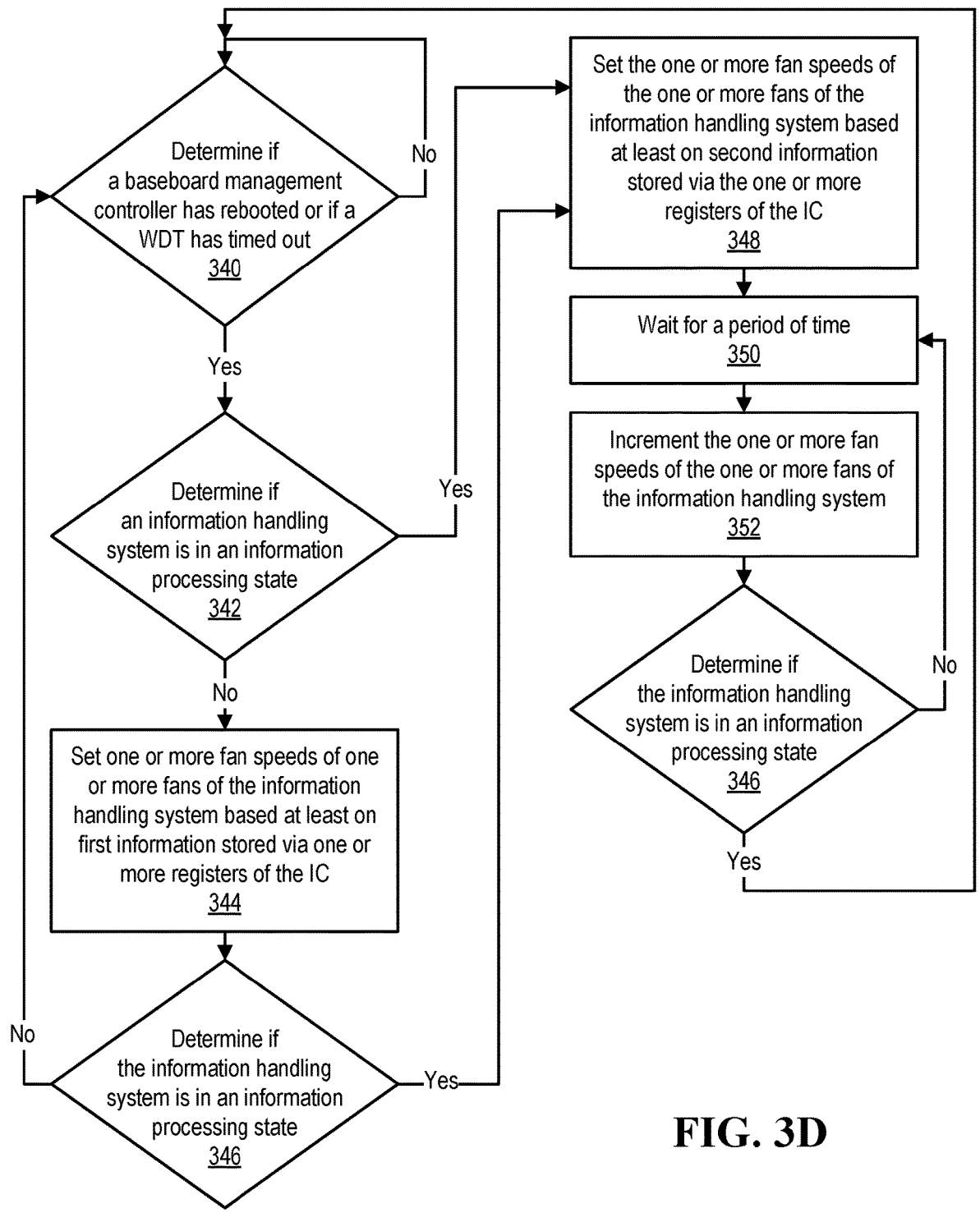
FIG. 3D illustrates an example of a method of operating an integrated circuit, according to one or more embodiments.

Turning now to FIG. 3D, an example of a method of operating an integrated circuit is illustrated, according to one or more embodiments. At 340, it may be determined if a baseboard management controller has rebooted or if a watchdog (WDT) has timed out. For example, IC 132 may determine if BMC 132 has rebooted or if a WDT 146 has timed out. In one or more embodiments, determining if BMC 132 has rebooted may include determining if a signal from the baseboard management controller has changed. For example, determining if a signal from the baseboard management controller has changed may include determining if the signal from the baseboard management controller has toggled.

If the baseboard management controller has rebooted or if the WDT has timed out, it may be determined if an information handling system is in an information processing state, at 342. For example, IC 132 may determine if IHS 110 is in an information processing state. In one or more embodiments, the information processing state may be ACPI power state S0. When the information handling system is not in the information processing state, the information handling system may be in a power conservation state (e.g., a stand-by state). For example, the power conservation state may be ACPI power state S5.

If the information handling system is in the information processing state, the method may proceed to 348, according to one or more embodiments. If the information handling system is not in the information processing state, one or more fan speeds of one or more fans of the information handling system may be set based at least on information stored via one or more registers of the IC, at 344. For example, one or more fan speeds of one or more of fans 138A-138E of IHS 110 may be set based at least on information stored via one or more registers 142A-142C of IC 132.

In one or more embodiments, at least a portion of a register 142 may store fan speed information associated with IHS 110 in a power conservation mode or a stand-by mode. For example, a register portion 410A of a register 142, illustrated in FIG. 4, may store fan speed information associated with IHS 110 in a power conservation mode or a stand-by mode (e.g., ACPI power state S5). Although register 142 is illustrated with portions 410A-410C, register 142 may include any number of portions, according to one or more embodiments. The fan speed information may be a PWM value. IC 132 may provide fan speed information (e.g., a PWM value) associated with IHS 110 in the power conservation mode or the stand-by mode to a fan control module 136. Fan control module 136 may utilize the fan speed information (e.g., a PWM value) to set one or more speeds of one or more fans 138. For example, fan control module 136 may utilize the fan speed information (e.g., a PWM value) to set one or more speeds of one or more fans 138 of a zone 140 associated with fan control module 136. In one instance, fan control module 136A may utilize the fan speed information (e.g., a PWM value) to set speeds of fans 138A and 138B of zone 140A. In a second instance, fan control module 136B may utilize the fan speed information (e.g., a PWM value) to set speeds of fans 138C and 138D of zone 140B. In another instance, fan control module 136C may utilize the fan speed information (e.g., a PWM value) to set a speed of fan 138E of zone 140C.

At 346, it may be determined if the information handling system is in an information processes state. If the information handling system is not in the information processes state, the method may proceed to 340, according to one or more embodiments. If the information handling system is in the information processes state, one or more fan speeds of one or more fans of the information handling system may be set based at least on information stored via one or more registers of the IC, at 348. For example, one or more fan speeds of one or more of fans 138A-138E of IHS 110 may be set based at least on information stored via one or more registers 142A-142C of IC 132.

In one or more embodiments, at least a portion of a register 142 may store fan speed information associated with IHS 110 in an information processes state. For example, a register portion 410B of a register 142, illustrated in FIG. 4, may store fan speed information associated with IHS 110 in an information processes state (e.g., ACPI power state S0). The fan speed information may be a PWM value. IC 132 may provide fan speed information (e.g., a PWM value) associated with IHS 110 in the information processes state to a fan control module 136. Fan control module 136 may utilize the fan speed information (e.g., a PWM value) to set one or more speeds of one or more fans 138. For example, fan control module 136 may utilize the fan speed information (e.g., a PWM value) to set one or more speeds of one or more fans 138 of a zone 140 associated with fan control module 136. In one instance, fan control module 136A may utilize the fan speed information (e.g., a PWM value) to set speeds of fans 138A and 138B of zone 140A. In a second instance, fan control module 136B may utilize the fan speed information (e.g., a PWM value) to set speeds of fans 138C and 138D of zone 140B. In another instance, fan control module 136C may utilize the fan speed information (e.g., a PWM value) to set a speed of fan 138E of zone 140C.

At 350, the IC may wait for a period of time. For example, IC 132 may wait for a period of time. In one or more embodiments, the period of time may be based at least on an amount of time for a reboot of BMC 130. At 352, it may be determined if the information handling system is in an information processing state. For example, IC 132 may determine if IHS 110 is in an information processing state. If the information handling system is in the information processing state, the method may proceed to 350, according to one or more embodiments. If the information handling system is not in the information processing state, the method may proceed to 340, according to one or more embodiments.

Figure 5A:
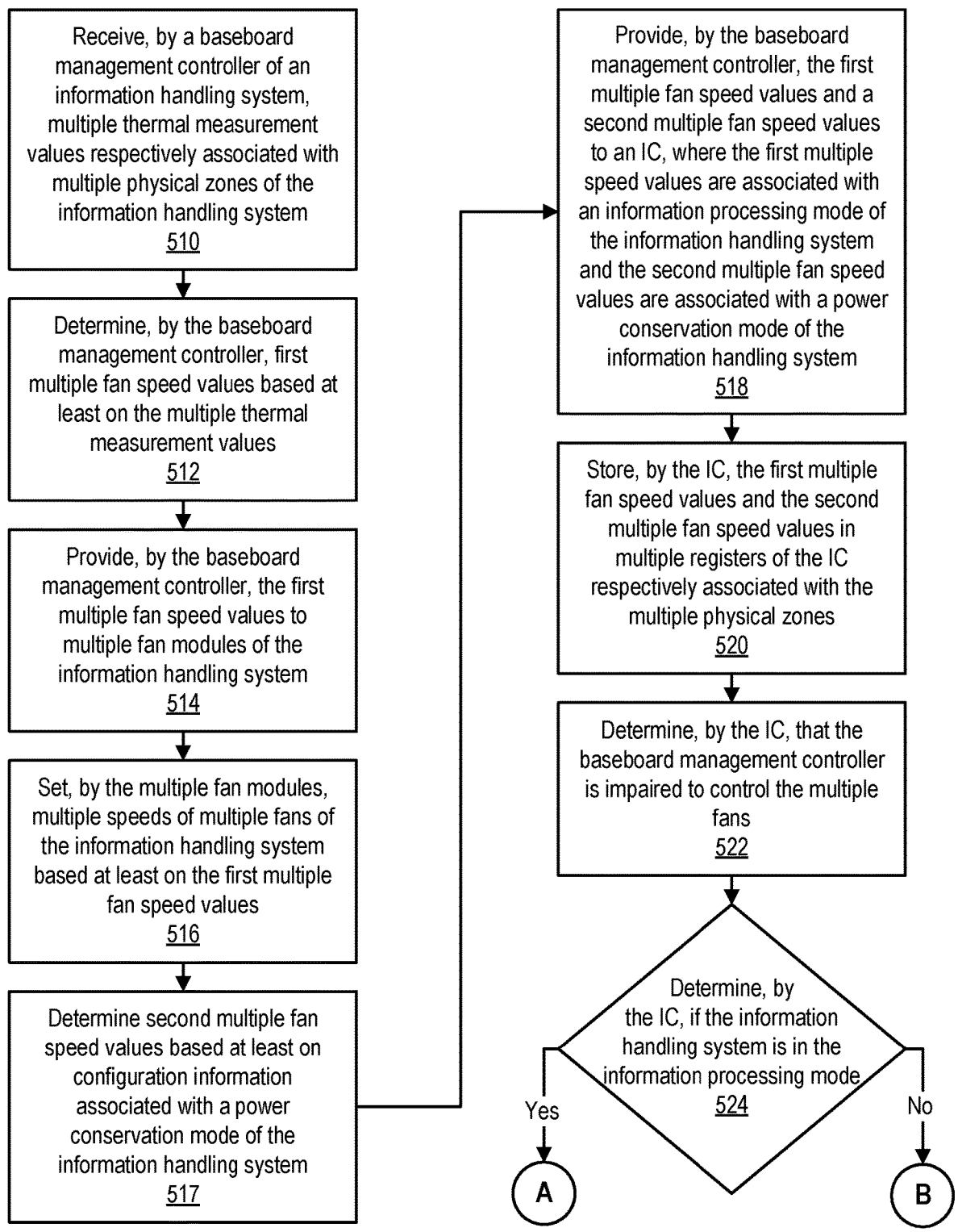
FIGS. 5A-5C illustrate an example of a method of operating fans of an information handling system, according to one or more embodiments.
Figure 5B:
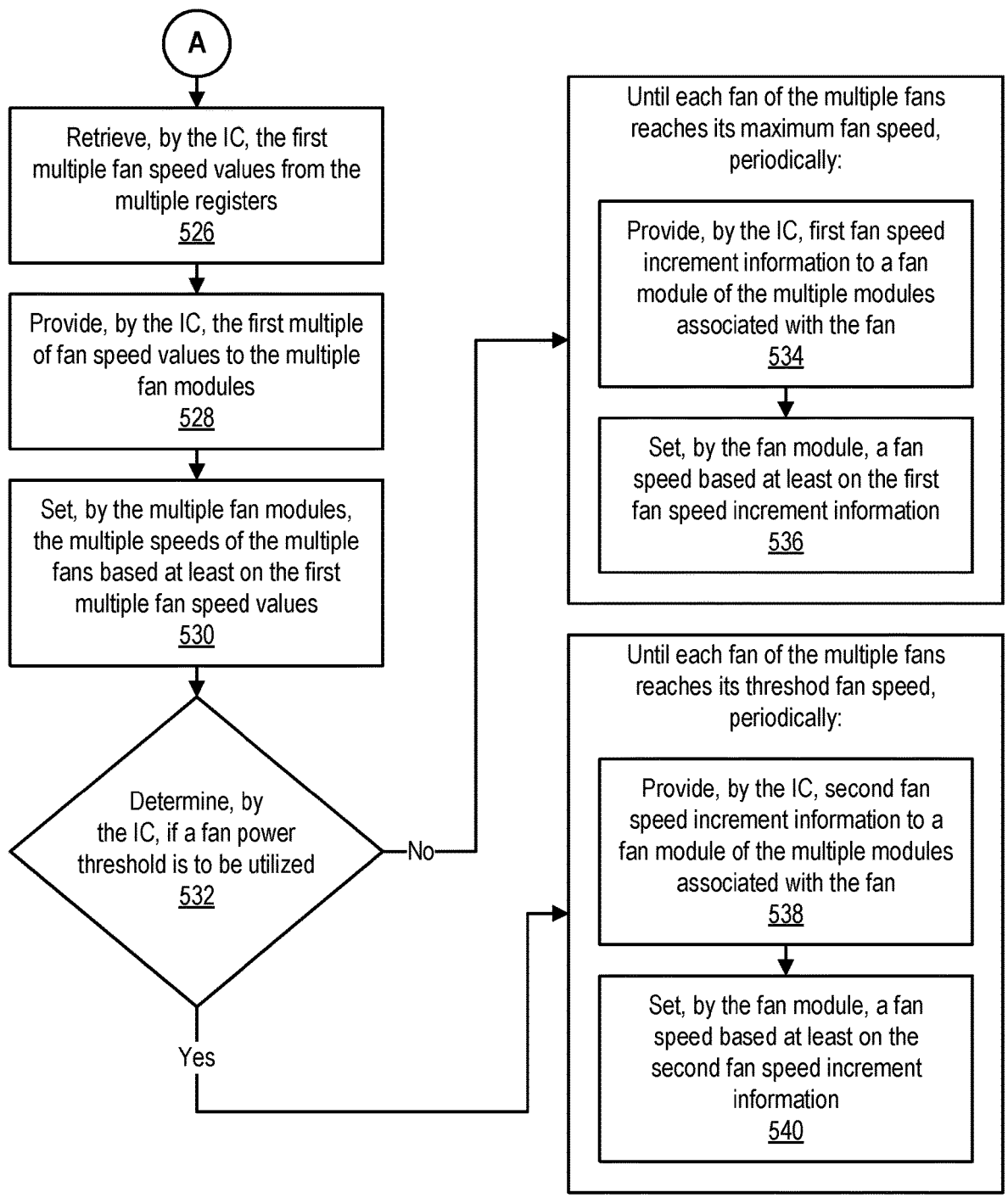
Figure 5C:
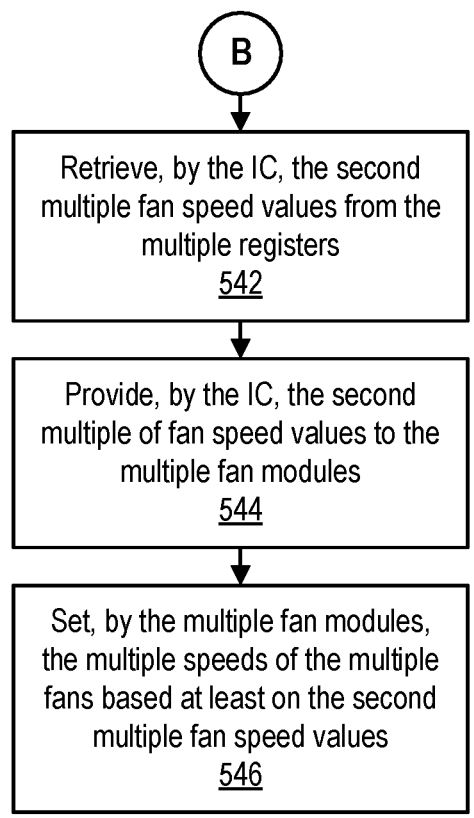

Turning now to FIGS. 5A-5C, an example of a method of operating fans of an information handling system is illustrated, according to one or more embodiments. At 510, a baseboard management controller of an information handling system may receive multiple thermal measurement values respectively associated with multiple physical zones of the information handling system. For example, BMC 130 may receive multiple thermal measurement values respectively associated with physical zones 140A-140C. For instance, BMC 130 may receive multiple thermal measurement values from sensors 139A-139C, respectively associated with physical zones 140A-140C. In one or more embodiments, a thermal measurement value may include digital temperature measurement data.

At 512, first multiple fan speed values may be determined, by the baseboard management controller, based at least on the multiple thermal measurement values. For example, BMC 130 may determine first multiple fan speed values based at least on the multiple thermal measurement values. At 514, the first multiple fan speed values may be provided, by the baseboard management controller, to multiple fan modules of the information handling system. For example, BMC 130 may provide the first multiple fan speed values to fan modules 136A-136C. In one instance, a fan speed value, of the first multiple fan speed values, provided to fan module 136A may be different from another fan speed value, of the first multiple fan speed values, provided to fan module 136B. In one instance, a fan speed value, of the first multiple fan speed values, provided to fan module 136A may be the same as another fan speed value, of the first multiple fan speed values, provided to fan module 136B.

At 516, multiple speeds of multiple fans of the information handling system may be set, by the multiple fan modules, based at least on the first multiple fan speed values. For example, fan modules 136A-136C may set speeds of fans 138A-138E based at least on the first multiple fan speed values. In one instance, fan module 136A may set speeds of fans 138A and 138B based at least on a first fan speed of the first multiple fan speed values. In a second instance, fan module 136B may set speeds of fans 138C and 138D based at least on a second fan speed of the first multiple fan speed values. In another instance, fan module 136C may set a speed of fan 138E based at least on a third fan speed of the first multiple fan speed values.

At 517, second multiple fan speed values may be determined based at least on configuration information associated with a power conservation mode of the information handling system. For example, BMC 130 may determine second multiple fan speed based at least on configuration information associated with a power conservation mode of the information handling system. For instance, BMC 130 may store configuration information. The configuration information may include second multiple fan speed values associated with a power conservation mode of the information handling system. For example, the second multiple fan speed values may include fan speed values that are fifty percent (50%) of maximum fan speed values. In one or more embodiments, determining the second multiple fan speed values may include retrieving the second multiple fan speed values from the configuration information stored by BMC 130

At 518, the first multiple fan speed values and the second multiple fan speed values may be provided, by the baseboard management controller, to an IC. For example, BMC 130 may provide the first multiple fan speed values and second multiple fan speed values to IC 132. In one instance, the first multiple speed values are associated with an information processing mode (e.g., ACPI state S0) of IHS 110. In another instance, the second multiple fan speed values are associated with a power conservation mode (e.g., ACPI state S5) of IHS 110.

In one or more embodiments, the information processing mode may include a processor of the information handling system executing instructions or may be ready to execute instructions. For example, the information processing mode may include a volatile memory medium being continually refreshed. In one or more embodiments, the power conservation mode may include a processor of the information handling system not executing instructions or may not be ready to execute instructions.

At 520, the first multiple fan speed values and the second multiple fan speed values may be stored, by the IC, in multiple registers of the IC respectively associated with the multiple physical zones. For example, IC 132 may store the first multiple fan speed values and the second multiple fan speed values in registers 142A-142C. In one instance, IC 132 may store the first multiple fan speed values in a register portion 410A of respective registers 142A-142C. In another instance, IC 132 may store the second multiple fan speed values in a register portion 410B of respective registers 142A-142C.

At 522, it may be determined, by the IC, that the baseboard management controller is impaired to control the multiple fans. For example, IC 132 may determine that BMC 130 is impaired to control fans 138A-138E. In one instance, BMC 130 may be rebooting, which may cause BMC 130 to be impaired to control fans 138A-138E. In another instance, BMC 130 may be heavily loaded, which may cause BMC 130 to be impaired to control fans 138A-138E.

At 524, it may be determined, by the IC, if the information handling system is in the information processing mode. For example, IC 132 may determine if IHS 110 is in the information processing mode (e.g., ACPI state S0). If the information handling system is in the information processing mode, the first multiple fan speed values may be retrieved, by the IC, from the multiple registers, at 526. For example, IC 132 may retrieve the first multiple fan speed values from registers 142A-142B. For instance, IC 132 may retrieve the first multiple fan speed values from register portions 410A of registers 142A-142B.

At 528, the first multiple of fan speed values may be provided, by the IC, to the one or more fan modules. For example, IC 132 may provide the first multiple of fan speed values to fan modules 136A-136C. At 530, the multiple speeds of the multiple fans may be set, by the multiple fan modules, based at least on the first multiple fan speed values. For example, fan modules 136A-136C may set the multiple speeds of fans 138A-138E based at least on the first multiple fan speed values. In one instance, fan module 136A may set speeds of fans 138A and 138B based at least on a first fan speed value of the first multiple fan speed values. In a second instance, fan module 136B may set speeds of fans 138C and 138D based at least on a second fan speed value of the first multiple fan speed values. In another instance, fan module 136C may set a speed of fan 138E based at least on a third fan speed value of the first multiple fan speed values.

At 532, it may be determined, by the IC, if a fan speed threshold is to be utilized. For example, IC 132 may determine if a fan speed threshold is to be utilized. For instance, IC 132 may retrieve information from register 144 to determine if the fan speed threshold is to be utilized. A portion 420A of register 144, illustrated in FIG. 4, may store information that indicates whether or not the fan speed threshold is to be utilized. Although portions 420A-420C are illustrated, register 144 may include any number of portions, according to one or more embodiments.

If the fan speed threshold is not to be utilized, first fan speed increment information may be provided, by the IC, to a fan module of the multiple modules associated with the fan, at 534. For example, IC 132 may provide first fan speed increment information to a fan module 136 associated with fan 138. At 536, a fan speed may be set, by the fan module, based at least on the first fan speed increment information. For example, fan module 136 may set a fan speed based at least on the first fan speed increment information. For instance, fan module 136 may set one or more fan speeds based at least on fan speed increment information received from IC 132.

Figure 6A:
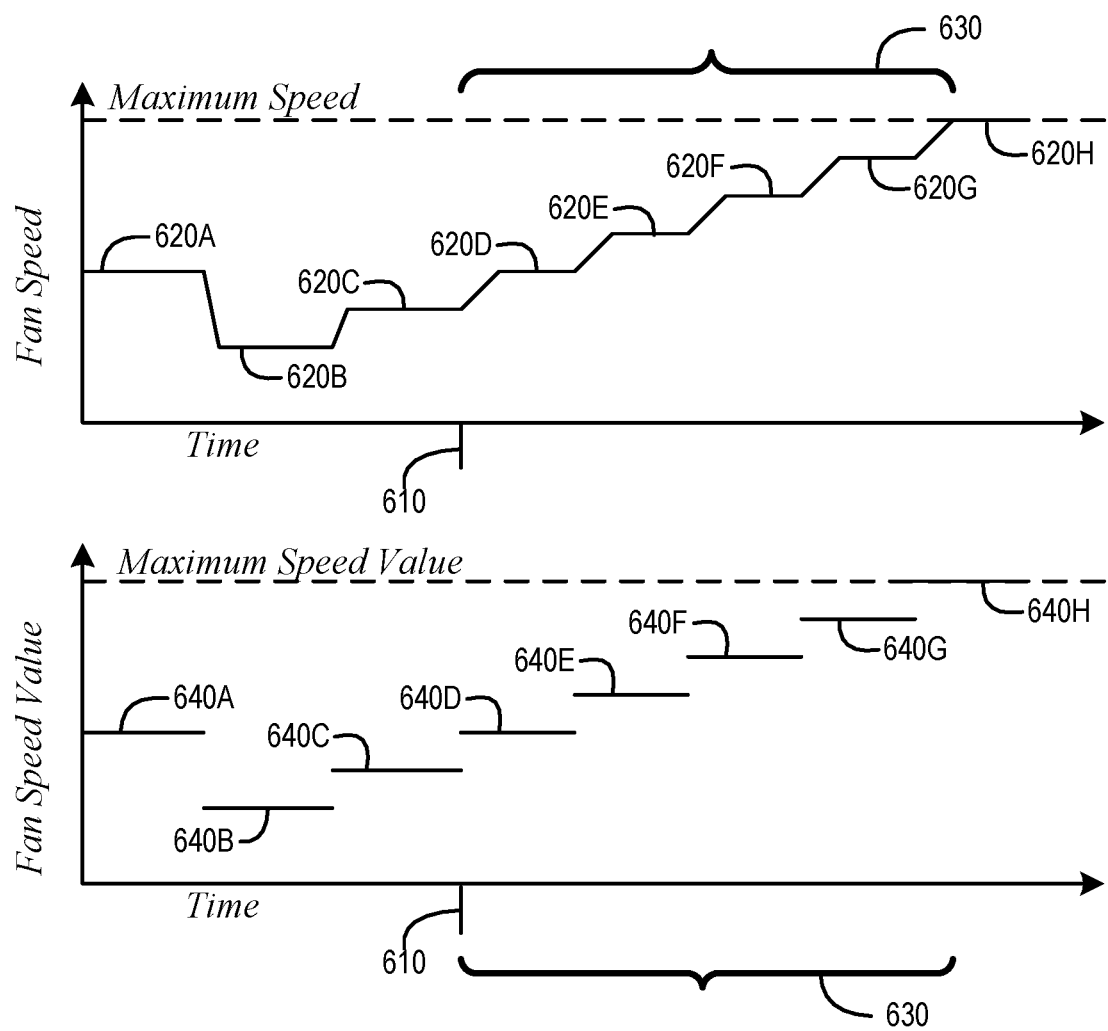
FIG. 6A illustrates an example of periodically increasing a speed of a fan to a maximum fan speed, according to one or more embodiments.

In one or more embodiments, method elements 534 and 536 may be repeated periodically until each fan of the multiple fans reaches its maximum fan speed. As an example, a fan 138 may set to a fan speed 620A, as illustrated in FIG. 6A. Fan speed 620A may be based at least on a fan speed value 640A. In one or more embodiments, fan 138 may rotate with fan speed 620 in response to being set with fan speed value 640. Fan 138 may set to a fan speed 620B based at least on a fan speed value 640B. Fan 138 may set to a fan speed 620C based at least on a fan speed value 640C. At a time 610, it may be determined that BMC 130 is impaired to control fans 138A-138E. In one or more embodiments, a speed of fan 138 may be periodically increased until fan 138 reaches its maximum fan speed. A speed of fan 138 may be periodically increased over a period of time 630. For example, period of time 630 may be associated with an amount of time to boot or reboot BMC 130. As shown in FIG. 6A, a speed of fan 138 may be periodically increased to fans speeds 620D-620H in response to respective fan speed values 640D-640H. In one or more embodiments, fan speed increment information may include a fan speed value of fan speed values 640D-640H. For example, first fan speed increment information may include a fan speed value of fan speed values 640D-640H.

If the fan speed threshold is to be utilized, second fan speed increment information may be provided, by the IC, to a fan module of the multiple modules associated with the fan, at 538. For example, IC 132 may provide second fan speed increment information to a fan module 136 associated with fan 138. At 540, a fan speed may be set, by the fan module, based at least on the second fan speed increment information. For example, fan module 136 may set a fan speed based at least on the second fan speed increment information. For instance, fan module 136 may set one or more fan speeds based at least on fan speed increment information received from IC 132.

Figure 6B:
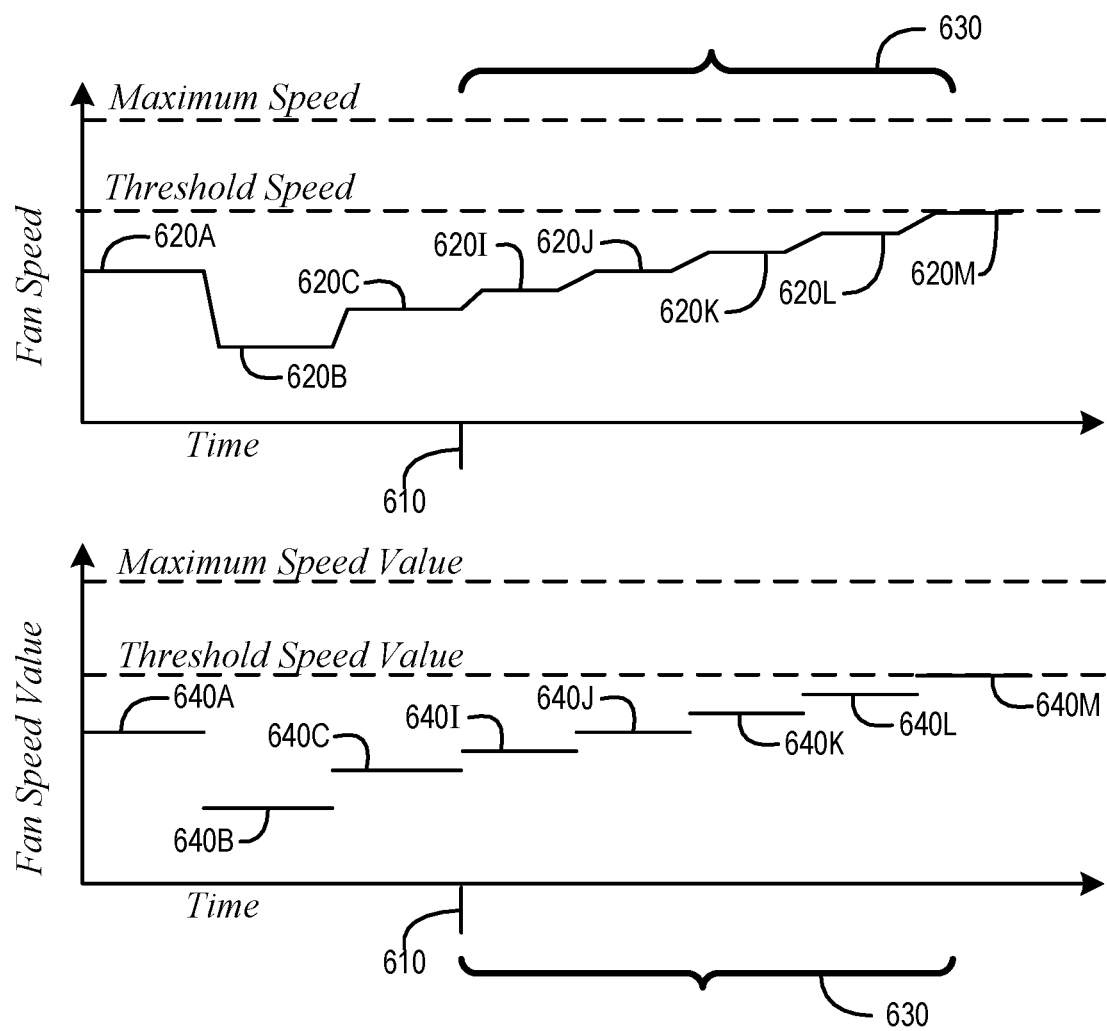
FIG. 6B illustrates an example of periodically increasing a speed of a fan to a threshold fan speed, according to one or more embodiments.

In one or more embodiments, method elements 538 and 540 may be repeated periodically until each fan of the multiple fans reaches its threshold fan speed, less than its maximum fan speed. For example, a threshold speed value may be stored via a portion 420B of register 144, as illustrated in FIG. 4. For instance, the threshold speed value may include a PWM value. As an example, a fan 138 may set to a fan speed 620A, as illustrated in FIG. 6B. Fan speed 620A may be based at least on a fan speed value 640A. In one or more embodiments, fan 138 may rotate with fan speed 620 in response to being set with fan speed value 640. Fan 138 may set to a fan speed 620B based at least on a fan speed value 640B. Fan 138 may set to a fan speed 620C based at least on a fan speed value 640C. At a time 610, it may be determined that BMC 130 is impaired to control fans 138A-138E. In one or more embodiments, a speed of fan 138 may be periodically increased until fan 138 reaches a threshold fan speed. A speed of fan 138 may be periodically increased over a period of time 630. For example, period of time 630 may be associated with an amount of time to boot or reboot BMC 130. As shown in FIG. 6B, a speed of fan 138 may be periodically increased to fans speeds 620I-620M in response to respective fan speed values 640I-640M. In one or more embodiments, fan speed increment information may include a fan speed value of fan speed values 640I-640M. For example, second fan speed increment information may include a fan speed value of fan speed values 640I-640M.

If the information handling system is not in the information processing mode, the second multiple fan speed values may be retrieved, by the IC, from the multiple registers, at 542. For example, IC 132 may retrieve the second multiple fan speed values from registers 142A-142B. For instance, IC 132 may retrieve the second multiple fan speed values from register portions 410B of registers 142A-142B. At 544, the second multiple of fan speed values may be provided, by the IC, to the multiple modules. For example, IC 132 may provide second multiple of fan speed values to fan modules 136A-136C.

At 546, the multiple speeds of the multiple fans may be set, by the multiple fan modules, based at least on the second multiple fan speed values. For example, fan modules 136A-136C may set the multiple speeds of fans 138A-138E based at least on the second multiple fan speed values. In one instance, fan module 136A may set the multiple speeds of fans 138A and 138B based at least on a first fan speed value of the second multiple fan speed values. In a second instance, fan module 136B may set the multiple speeds of fans 138C and 138D based at least on a second fan speed value of the second multiple fan speed values. In another instance, fan module 136B may set the multiple speeds of fans 138C and 138D based at least on a third fan speed value of the second multiple fan speed values. In one or more embodiments, a fan speed value of the second multiple fan speed values may be fifty percent (50%) of a maximum fan speed value. In one or more embodiments, all of the second multiple fan speed values may be fifty percent (50%) of a maximum fan speed value.

In one or more embodiments, one or more of the method and/or process elements and/or one or more portions of a method and/or a process element may be performed in varying orders, may be repeated, or may be omitted. Furthermore, additional, supplementary, and/or duplicated method and/or process elements may be implemented, instantiated, and/or performed as desired, according to one or more embodiments. Moreover, one or more of system elements may be omitted and/or additional system elements may be added as desired, according to one or more embodiments.

In one or more embodiments, a memory medium may be and/or may include an article of manufacture. For example, the article of manufacture may include and/or may be a software product and/or a program product. For instance, the memory medium may be coded and/or encoded with processor-executable instructions in accordance with at least a portion of one or more flowcharts, at least a portion of one or more systems, at least a portion of one or more methods, and/or at least a portion of one or more processes described herein to produce the article of manufacture.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An information handling system, comprising:
   at least one processor;
   a non-volatile memory medium, coupled to the at least one processor, that stores instructions executable by the at least one processor;
   a baseboard management controller (BMC) coupled to the at least one processor; an integrated circuit (IC) coupled to the BMC;
   a plurality of fan controllers coupled to the BMC and the IC, wherein each fan controller is associated with a physical zone of a plurality of physical zones; and
   a plurality of fans, wherein each fan of the plurality of fans is coupled to a fan controller of the plurality of fan controllers, wherein each physical zone of the plurality of physical zones is cooled by one or more fans of the plurality of fans;

wherein the BMC is configured to:
receive a plurality of thermal measurement values respectively associated with the plurality of physical zones;
determine a first plurality of fan speed values based at least on the plurality of thermal measurement values and corresponding to an information processing mode of the information handling system;
determine a second plurality of fan speed values based at least on configuration information associated with a power conservation mode of the information handling system;
provide the first plurality of fan speed values and the second plurality of fan speed values to the IC;

wherein the IC is configured to:
store the first plurality of fan speed values and the second plurality of fan speed values in a plurality of registers of the IC respectively associated with the plurality of physical zones;
determine, based on an event comprising one of a reboot associated with a power cycle of the BMC, the information handling system has been idle, or a watchdog timer has timed out, BMC is impaired;
in response to that the IC determines the event comprises the reboot associated with the power cycle of the BMC, provide a signal to operate the plurality of fans at 50% of a maximum fan speed before the information handling system reboots;
in response to that the IC determines the event comprises the information handling system has been idle, provide a signal to update one or more of the first plurality of fan speed values and the second plurality of fan speed values in the plurality of registers;
in response to that the IC determines the event comprises the watchdog timer has timed out, determine if the information handling system is in the information processing mode, the information processing mode comprising one or more the processor executing instructions and a volatile memory medium being continually refreshed, wherein:
in response to the information handling system is in the information processing mode:
retrieve the first plurality of fan speed values from the plurality of registers; and
provide the first plurality of fan speed values to the plurality of fan controllers; and
in response to handling system is not in the information processing mode:
retrieve the second plurality of fan speed values from the plurality of registers; and
provide the second plurality of fan speed values to the plurality of fan controllers; and
wherein each fan controller in the plurality of fan controllers is configured to:
receive, from the IC, a fan speed value of one of the first plurality of fan speed values or the second plurality of fan speed values; and
set a fan speed of a fan coupled to the fan controller based on the fan speed value received from the IC.

2. The information handling system of claim 1,
wherein the IC is further configured to:
in response to the information handling system is in the information processing mode:
provide a first fan speed value of the first plurality of fan speed values to a fan controller of the plurality of fan controllers;
until the fan coupled to the fan controller reaches the maximum fan speed, periodically provide fan speed increment information to the fan controller.

3. The information handling system of claim 2,
wherein the information handling system is associated with a power budget; and
wherein the maximum fan speed is based at least on the power budget.

4. The information handling system of claim 1,
wherein the IC is further configured to:
in response to the information handling system is not in the information processing mode, until the plurality of fans reach the maximum fan speed, periodically:
provide, by the IC, fan speed increment information to the plurality of fan controllers; and
wherein the plurality of fan controllers are further configured to:
in response to the information handling system is not in the information processing mode, until the plurality of fans reach the maximum fan speed, periodically:
set the plurality of fan speeds of the plurality of fans based at least on the fan speed increment information.

5. The information handling system of claim 1, wherein the IC includes at least one of a field programmable gate array (FPGA), a complex logic device (CPLD), and an application specific integrated circuit (ASIC).

6. The information handling system of 1, further comprising:
the volatile memory medium coupled to the at least one processor;
wherein a physical zone of the plurality of physical zones includes the volatile memory medium.

7. The information handling system of claim 1, wherein the IC is further configured to:
receive fan speed information via a bus coupled to the BMC and the IC;
determine that traffic has occurred on the bus; and
in response to determining that the traffic has occurred on the bus, reset the watchdog timer.

8. The information handling system of claim 1, wherein, to determine that the BMC is impaired, the IC is further configured to determine that a signal from the BMC to the IC has changed.

9. The information handling system of claim 1, further comprising:
a sensor;
wherein the sensor is configured to convert an ambient temperature of a physical zone of the plurality of physical zones to a thermal measurement value of the plurality of thermal measurement values; and
wherein, to receive the plurality of thermal measurement values, the BMC is further configured to receive the thermal measurement value of the plurality of thermal measurement values from the sensor.

10. A method, comprising:
receiving, by a baseboard management controller (BMC) of an information handling system, a plurality of thermal measurement values respectively associated with a plurality of physical zones of the information handling system, wherein each physical zone of the plurality of physical zones is cooled by one or more fans of a plurality of fans;

determining, by the BMC, a first plurality of fan speed values based at least on the plurality of thermal measurement values and corresponding to an information processing mode of the information handling system;

determining, by the BMC, a second plurality of fan speed values based at least on configuration information associated with a power conservation mode of the information handling system;

providing, by the BMC, the first plurality of fan speed values and the second plurality of fan speed values to an integrated circuit (IC) of the information handling system;

storing, by the IC, the first plurality of fan speed values and the second plurality of fan speed values in a plurality of registers of the IC respectively associated with the plurality of physical zones;

determining, by the IC, based on an event comprising one of a reboot associated with a power cycle of the BMC, the information handling system has been idle, or a watchdog timer has timed out, that the BMC is impaired;

in response to that the IC determines the event comprises the reboot associated with the power cycle of the BMC, providing a signal to operate the plurality of fans at 50% of a maximum fan speed before the information handling system reboots;

in response to that the IC determines the event comprises the information handling system has been idle, the IC providing a signal to update one or more of the first plurality of fan speed values and the second plurality of fan speed values in the plurality of registers;

in response to that the IC determines the event comprises the watchdog timer has timed out, determining, by the IC, if the information handling system is in the information processing mode;

in response to the information handling system is in the information processing mode:
  retrieving, by the IC, the first plurality of fan speed values from the plurality of registers;
  providing, by the IC, the first plurality of fan speed values to a plurality of an controllers;
  receiving, by the plurality of fan controllers, the first plurality of fan speed values; and
  setting, by the plurality of fan controllers, the plurality of fan speeds of the plurality of fans based on the first plurality of fan speed values; and in response to the information handling system is not in the information processing mode:
  retrieving, by the IC, the second plurality of fan speed values from the plurality of registers;
  providing, by the IC, the second plurality of fan speed values to the plurality of fan controllers;
  receiving, by the plurality of fan controllers, the second plurality of fan speed values; and
  setting, by the plurality of fan controllers, the plurality of fan speeds of the plurality of fans based on the second plurality of fan speed values.

11. The method of claim 10, further comprising:
in response to the information handling system is in the information processing mode:
  providing, by the IC, a first fan speed value of the first plurality of fan speed values to a fan controller of the plurality of fan controllers, wherein the fan controller is associated with a fan of the plurality of fans; and
  until the fan reaches the maximum fan speed, periodically providing, by the IC, first fan speed increment information to the fan controller of the plurality of fan controllers associated with the fan; and
  increasing, by the fan controller, the first fan speed based at least on the first fan speed increment information.

12. The method of claim 11,
wherein the information handling system is associated with a power budget; and
wherein the first fan speed value is based at least on the power budget.

13. The method of claim 10, further comprising:
in response to the information handling system is not in the information processing mode, until a fan of the plurality of fans reaches the maximum fan speed, periodically:
  providing, by the IC, fan speed increment information to a fan controller associated with the fan; and
  setting the fan speed of the fan based at least on the fan speed increment information.

14. The method of claim 10, wherein the IC includes at least one of a field programmable gate array (FPGA), a complex logic device (CPLD), and an application specific integrated circuit (ASIC).

15. The method of 10, wherein a physical zone of the plurality of physical zones includes a volatile memory medium of the information handling system.

16. The method of claim 10, wherein the IC is configured to receive fan speed information via a bus coupled to the BMC and the IC;
the method further comprising:
  determining, by the IC, that traffic has occurred on the bus; and
  in response to the determining that the traffic has occurred on the bus, resetting, by the IC, the watchdog timer.

17. The method of claim 10, wherein the determining that the BMC is impaired includes determining that a signal from the BMC to the IC has changed.

18. The method of claim 10, further comprising:
converting, by a sensor of the information handling system, an ambient temperature of a physical zone of the plurality of physical zones to a thermal measurement value of the plurality of thermal measurement values;
wherein the receiving the plurality of thermal measurement values includes receiving the thermal measurement value of the plurality of thermal measurement values from the sensor.

* * * * *